United States Patent [19]

Sakurai et al.

[11] Patent Number: 5,291,534
[45] Date of Patent: Mar. 1, 1994

[54] CAPACITIVE SENSING DEVICE

[75] Inventors: Shizuki Sakurai, Nagoya; Tomio Nagata, Chiryu; Shiro Kuwahara, Anjo; Osamu Tabata, Aichi; Susumu Sugiyama, Nagoya, all of Japan

[73] Assignees: Toyoda Koki Kabushiki Kaisha, Kariya; Kabushiki Kaisha Toyota Chuo Kenkyusho, Aichi, both of Japan

[21] Appl. No.: 903,096

[22] Filed: Jun. 19, 1992

[30] Foreign Application Priority Data

Jun. 22, 1991 [JP] Japan .................. 3-177328
May 29, 1992 [JP] Japan .................. 4-163744

[51] Int. Cl.$^5$ .................................. G01L 19/04
[52] U.S. Cl. .................. 377/20; 361/283.4; 331/65; 307/308; 73/724
[58] Field of Search .............. 377/20; 361/283; 331/65; 307/308; 73/724

[56] References Cited

U.S. PATENT DOCUMENTS

| | | | |
|---|---|---|---|
| 3,838,684 | 10/1974 | Manuel et al. | 128/690 |
| 4,227,419 | 10/1980 | Park | 361/283 |
| 4,392,382 | 7/1983 | Myers | 73/724 |
| 4,398,426 | 8/1983 | Park et al. | 73/724 |
| 4,517,622 | 5/1985 | Male | 361/283 |
| 4,550,611 | 11/1985 | Czarnocki | 73/724 |
| 4,633,491 | 12/1986 | Kühnel | 377/20 |
| 4,793,187 | 12/1988 | Kordts | 73/724 |
| 4,864,463 | 9/1989 | Shkedi et al. | 361/283 |

FOREIGN PATENT DOCUMENTS 57-20634 2/1982 Japan .
59-500487 3/1984 Japan .
2-130014 5/1990 Japan .
3-269231 11/1991 Japan .

Primary Examiner—William L. Sikes
Assistant Examiner—Scott A. Ouellette
Attorney, Agent, or Firm—Oblon, Spivak, McClelland, Maier & Neustadt

[57] ABSTRACT

A digital capacitive sensing device comprises: a reference capacitor having a reference capacitance unaffected by a force to be measured; a reference pulse signal generating circuit which generates a reference pulse signal of a frequency corresponding to the reference capacitance; a sensing capacitor having capacitance variable according to the magnitude of the force; a measuring pulse signal generating circuit having a construction similar to that of the reference pulse signal generating circuit and capable of generating a measuring pulse signal of a frequency corresponding to the capacitance of the sensing capacitor; and a differential arithmetic circuit which adds the number of pulses of the reference pulse signal in a predetermined time interval to a set value and subtracts the number of pulses of the measuring pulse signal in a predetermined time interval from the set value. The reference pulse signal generating circuit is capable of compensating a zero point temperature characteristic of a detection value, and the measuring pulse signal generating circuit is capable of compensating a detection sensitivity temperature characteristic.

12 Claims, 17 Drawing Sheets

CAPACITIVE SENSING DEVICE

BACKGROUND OF THE INVENTION

1. Field of the Invention

The present invention relates to a capacitive sensing device capable of measuring various dynamical forces.

2. Description of the Related Art

A capacitive sensing device with a diaphragm is known as a device for measuring various dynamical forces. The device comprises a silicon substrate and a glass substrate. The diaphragm is formed by etching the silicon substrate with micromachining. The diaphragm can be deformed according to the various dynamical forces to be measured, such as pressure or acceleration. The glass substrate is disposed close to and separated by a small gap from the silicon substrate provided with the diaphragm so as to form a sensing capacitor. When the dynamical force is applied to the diaphragm, the diaphragm is deformed and a capacitance of the sensing capacitor varies. Accordingly, the dynamical force can be estimated through the measurement of the capacitance of the sensing capacitor. The sensing capacitor is inserted in an oscillation circuit to determine a frequency of an oscillation pulse signal. The capacitance of the sensing capacitor is measured by a frequency value of the oscillation pulse signal. That is, the capacitance is converted into the frequency value by a capacitance-frequency converter (c-f converter) and the frequency value of the oscillatory pulse signal output from the c-f converter is measured by a counter.

This known capacitive sensing device, however, has problems that the silicon substrate and the glass substrate joined to the silicon substrate are strained due to differences in thermal expansion coefficient between silicon and glass, and as a result, an output signal level of a CMOS circuit which is included in the c-f converter drifts with a temperature variation. Consequently, the frequency of the oscillatory output of the c-f converter varies according to temperature (temperature drift of the zero point) even if the dynamical force remains constant as a reference force, and a rate of a frequency deviation to a deviation of the applied dynamical force varies with a temperature variation (temperature drift of the sensitivity). Thus there occurs measuring errors in the measurements of the dynamical force.

A temperature compensation method disclosed in Japanese Patent Laid-open (Kokai) No. Hei 2-130014 employs an oscillation circuit where a driving voltage is designed so as to minimize the frequency shift for the temperature variation. FIG. 5 shows a capacitance detecting circuit employing a Schmidt trigger circuit and capable of temperature compensation. The temperature drift of frequency of the output of this capacitance detecting circuit can be reduced to a minimum when it is driven by a suitable driving voltage $V_{DD}$. FIG. 6 shows a relation between the frequency of the output signal and the driving voltage for different temperatures. Although the foregoing known capacitive sensing device is capable of temperature compensation of an offset value, i.e., a zero point, of a detection value, it is incapable of temperature compensation of the sensitivity. Even in the temperature compensation of the zero point, a curve representing the compensated zero point temperature characteristic, i.e., a curve representing a rate of the frequency deviation of the output signal for a temperature when no pressure is applied to the capacitive sensor, is flat only in a narrow temperature range, so that the temperature compensation of the frequency of the output is possible only in a narrow temperature range.

SUMMARY OF THE INVENTION

The present invention has been made to solve the foregoing problems in the prior art and it is therefore an object of the present invention to reduce measuring errors due to temperature variation in measuring a dynamical force with a capacitive sensing device.

Another object of the present invention is to compensate both the temperature characteristic of the sensitivity and that of the zero point of a capacitive sensing device simultaneously and to improve the linearity in the temperature characteristic of the zero point.

An invention made to solve the foregoing problems is a capacitive sensing device comprising:
  a sensing capacitor having capacitance variable according to a variation of a force to be measured;
  a measuring pulse signal generating circuit connected to the sensing capacitor for generating a measuring pulse signal with a frequency in accordance with capacitance of the sensing capacitor;
  a reference capacitor having a construction having a reference capacitance that is not affected by the force;
  a reference pulse signal generating circuit connected to the reference capacitor, having a construction similar to that of the measuring pulse signal generating circuit and capable of generating a reference pulse signal with a frequency in accordance with the reference capacitance; and
  a signal processing circuit for calculating a value of the force from frequencies of the reference pulse signal and the measuring pulse signal.

In a preferred embodiment, the measuring pulse signal generating circuit and the reference pulse signal generating circuit have oscillation circuits that provide the measuring pulse signal and the reference pulse signal, respectively. Ratios of frequency deviations of the measuring pulse signal and the reference pulse signal to temperature deviations are controlled by varying input voltages applied to the measuring pulse signal generating circuit and the reference pulse signal generating circuit, respectively. An input voltage applied to the measuring pulse signal generating circuit is adjusted so that a detection sensitivity is nearly constant for a temperature variation. An input voltage applied to the reference pulse signal generating circuit is adjusted so that a ratio of a deviation of a frequency difference between the measuring pulse signal and the reference pulse signal to a temperature deviation is nearly constant for a temperature variation.

In the other preferred embodiment, the signal processing circuit is a differential arithmetic circuit which calculates a difference between a number of pulses of the reference pulse signal in a predetermined time interval and a number of pulses of the measuring pulse signal in the predetermined time interval and provides a value according to the difference as a detected value of the force.

In another preferred embodiment, the signal processing circuit calculates a ratio of a frequency of the reference pulse signal to a frequency of the measuring pulse signal and outputs a value of the ratio as a detected value of the force.

In the another preferred embodiments, each of the measuring pulse signal generating circuit and the reference pulse signal generating circuit comprises a constant-current power circuit having a transistor which charges and discharges the sensing capacitor or the reference capacitor between two predetermined voltage levels, and a circuit having a transistor which changes a temperature characteristic of a charging and discharging current according to the input voltage.

The temperature characteristics of the detection sensitivity and the offset detection value are independently regulated to be constant for the temperature variations. Thus, the temperature compensation of sensitivity and the temperature compensation of zero point are achieved individually by the measuring pulse signal generating circuit and the reference pulse signal generating circuit, respectively.

The differential arithmetic circuit provides signals with a satisfactory temperature characteristic, varying in proportion to the measured force. Since the sensing capacitor and the reference capacitor are similar in construction, and the measuring pulse signal generating circuit and the reference pulse signal generating circuit are similar in construction, a temperature range in which the temperature compensation of the zero point of the difference between the reference frequency and the measuring frequency is wider than that in which the temperature compensation of the zero point of the measuring frequency can be achieved by the prior art method.

DESCRIPTION OF THE PREFERRED EMBODIMENTS

First Embodiment

A capacitive sensing device in a first embodiment according to the present invention is a pressure sensing device for measuring pressure.

(1) Pressure Sensor

Figure 3:
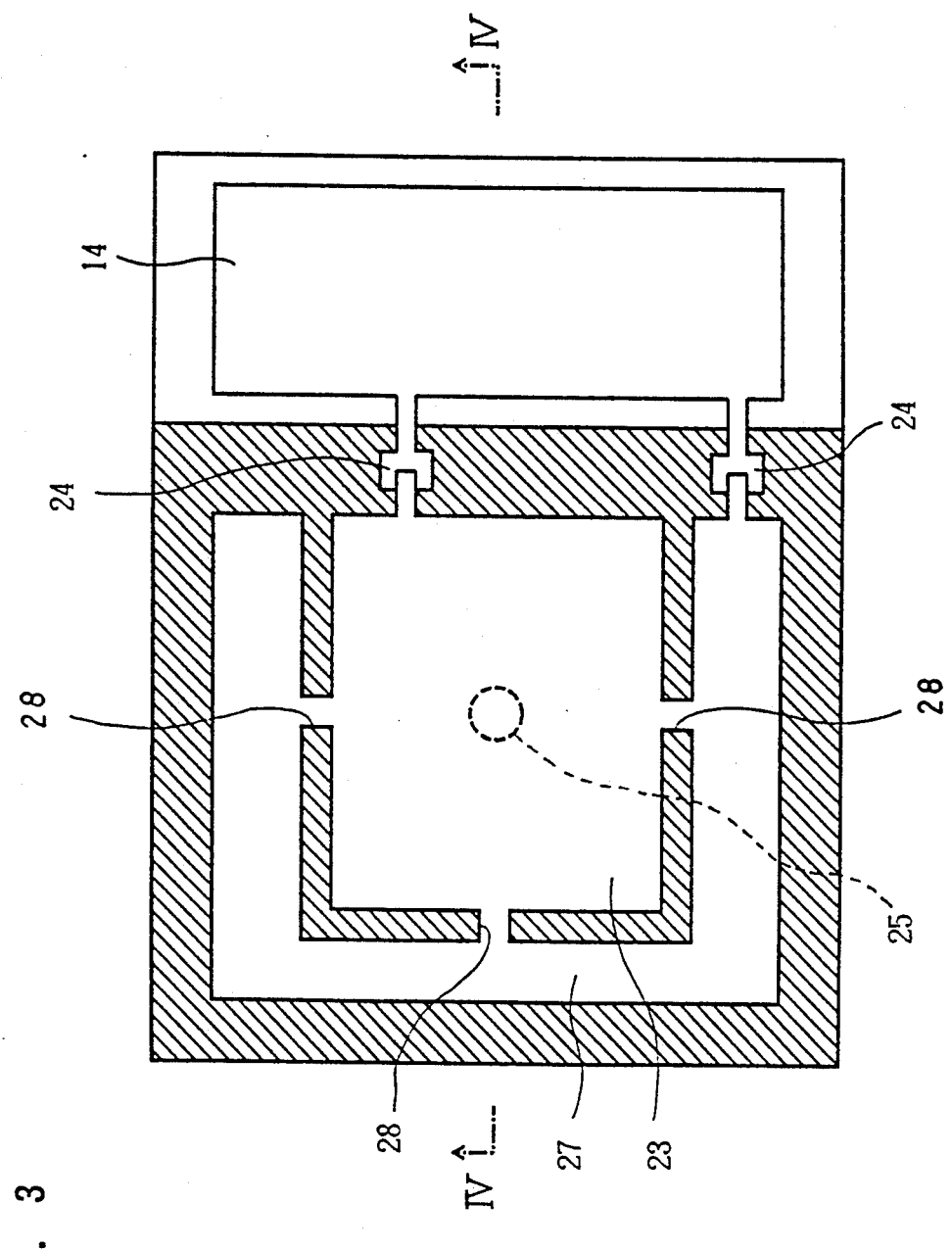
FIG. 3 is a plan view of a capacitive pressure sensing device in the first embodiment according to the present invention.
Figure 4:
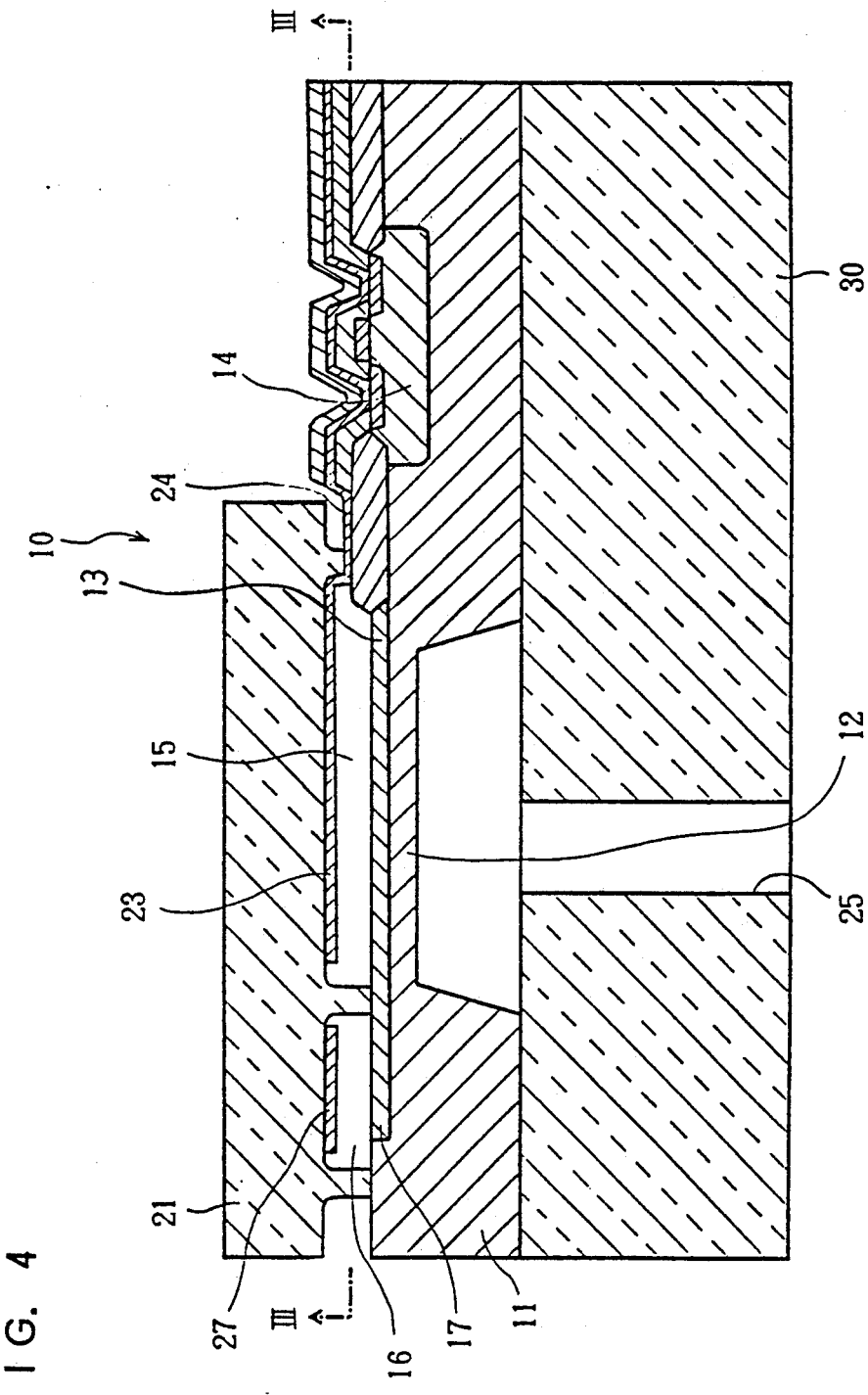
FIG. 4 is a sectional view of the capacitive pressure sensing device of FIG. 3.
Figure 5:
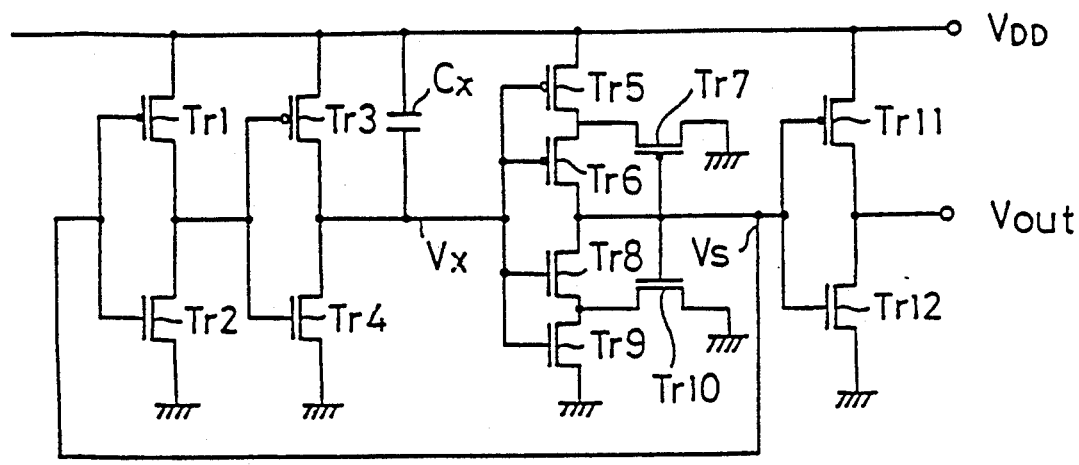
FIG. 5 is a circuit diagram of a prior art capacitive sensing device.
Figure 6:
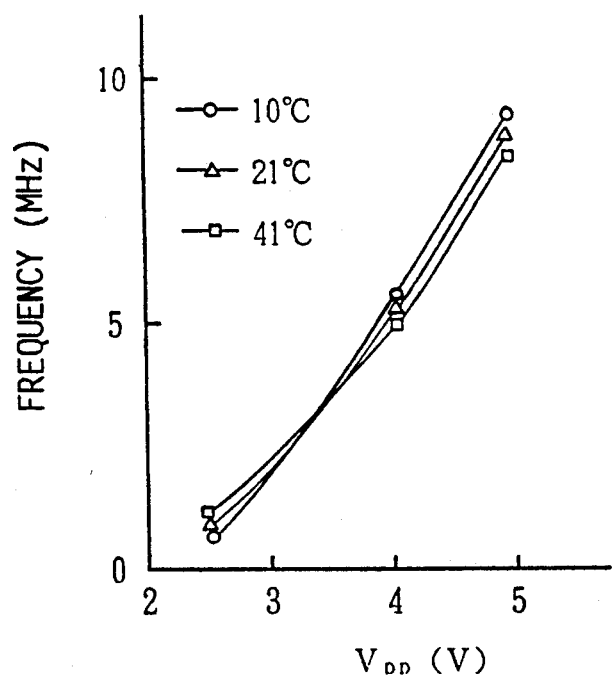
FIG. 6 is a graph showing a relation between a frequency of a signal output from the circuit shown in FIG. 5 and a driving voltage for different temperatures.

FIG. 3 is a plan view of a pressure sensor included in a capacitive pressure sensing device 10 embodying the present invention and FIG. 4 is a longitudinal sectional view taken on line IV-IV in FIG. 3.

Referring to FIGS. 3 and 4, a semiconductor substrate 11 formed of single crystal silicon has a pressure-sensing diaphragm portion 12 to which a pressure P is applied. An electrode 13 is formed on the pressure-sensing diaphragm portion 12, and a circuit 14 is formed in a region on the surface of the semiconductor substrate 11 by semiconductor device fabricating techniques. The electrode layer 13 is connected to the circuit 14 through connecting terminals 24.

An upper glass substrate 21 formed of, for example, Pyrex is provided with an electrode 23 opposite to the electrode 13. A lower glass substrate 30 is provided with a hole 25.

As shown in FIG. 4, the semiconductor substrate 11 and the upper glass substrate 21 are directly bonded together to form a reference pressure chamber 15 of the capacitive pressure sensing device 10. A sub-reference pressure chamber 16 is formed on the same plane as the reference pressure chamber 15 and the electrodes 13 and 23 are disposed on. The sub-reference pressure chamber 16 communicates with the reference pressure chamber 15. Correction electrodes 17 and 27 are formed respectively around the electrodes 13 and 23 so as to face small gaps in the sub-reference pressure chamber 16. The electrodes 13 and 23 and the correction electrodes 17 and 27 are connected through the connecting terminals 24 to the circuit 14.

The electrodes 13 and 23 and the reference pressure chamber 15 constitute a sensing capacitor Cx. The correction electrodes 17 and 27 and the sub-reference pressure chamber 16 constitute a reference capacitor Cr.

When a pressure is applied to the pressure-sensing diaphragm portion 12 of the capacitive pressure sensing device 10, the pressure-sensing diaphragm 12 bends toward the electrode 23 to change the interval between the electrodes 13 and 23, so that the capacitance of the capacitive pressure sensing device 10 changes. Since the sub-reference pressure chamber 16 is surrounded by rigid walls, the interval between the correction electrodes 17 and 27 remains unchanged even if the pressure P is applied to the pressure-sensitive diaphragm 12.

The reference pressure chamber 15 communicates with the sub-reference pressure chamber 16 through openings 28. Accordingly, the reference capacitor Cr and the sensing capacitor Cx are subjected to the same condition, i.e., the same temperature, the same humidity, the same disturbance other than the pressure to be measured and the same variation of the dielectric constant of the medium filling up the reference pressure chamber 15 and the sub-reference pressure chamber 16. Therefore, the capacitance of the reference capacitor Cr and the offset value, i.e., the capacitance of the sensing capacitor Cx to which a reference pressure is applied, vary with temperature in nearly equal characteristics.

(2) Capacitive Detecting Circuit

Figure 1:
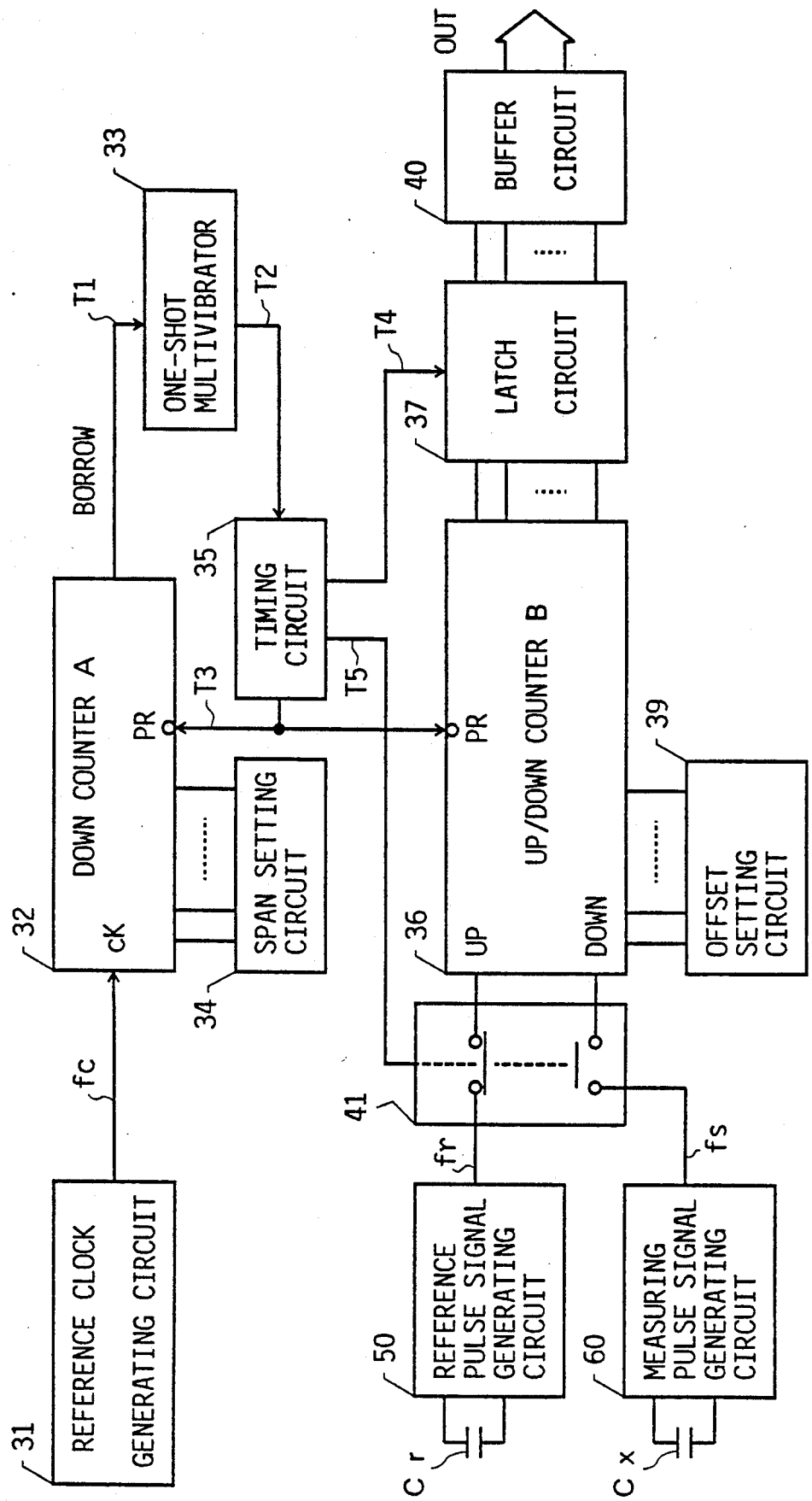
FIG. 1 is a circuit diagram of a pressure detecting circuit in the first preferred embodiment according to the present invention.
Figure 2:
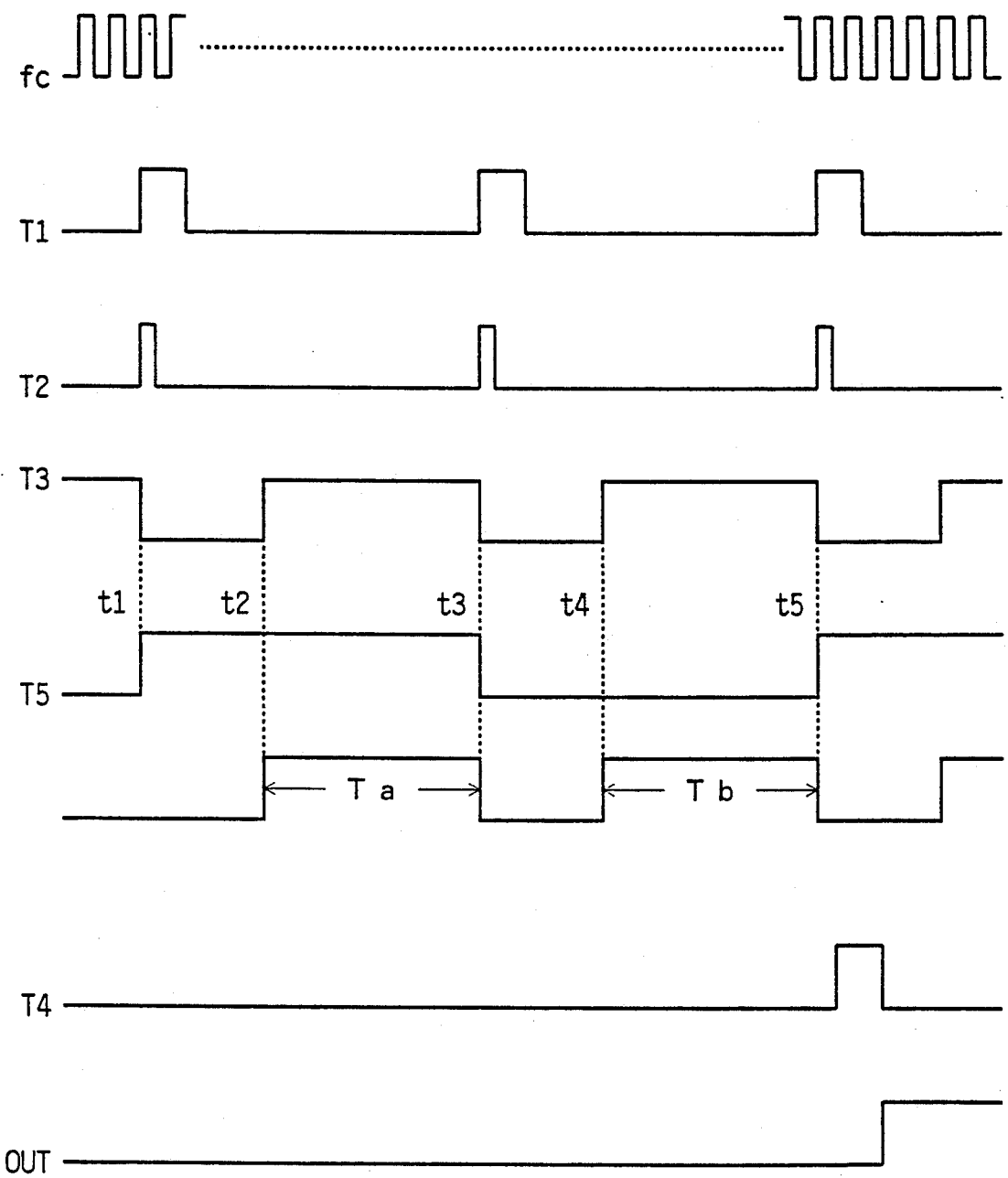
FIG. 2 is a timing chart for explaining an operation of the pressure detecting circuit of FIG. 1.

Referring to FIG. 1, a clock pulse signal with a predetermined frequency generated by a reference clock generating circuit 31 is applied to a counter 32. A span setting circuit 34 is connected to the counter 32. A reference pulse signal generating circuit 50 generates a reference pulse signal with a frequency fr. A measuring pulse signal generating circuit 60 generates a measuring pulse signal with a frequency fs. The span setting circuit 34 determines a measuring period T (Ta=Tb) (a predetermined time interval) for counting the number of pulses of the reference pulse signal fr and the number of pulses of the measuring pulse signal fs. The counter 32 is loaded with a value of the measuring period T determined by the span setting circuit 34. The value of the measuring period T is decremented by one at a time in synchronism with the output pulse signal of the reference clock generating circuit 31. When the count value of the counter 32 become equal to zero, a signal T1 becomes HIGH as shown in FIG. 2.

The reference clock generating circuit 31 employs a standard capacitor and has the same construction as that of the reference pulse signal generating circuit 50. A suitable voltage is applied to the reference clock generating circuit 31 for the temperature compensation to reduce the temperature drift of the output. The reference clock generating circuit 31 may employ a quartz oscillator, the characteristic of which is scarcely temperature-dependent.

A one-shot multivibrator 33 applies a pulse signal T2 to a timing circuit 35, which has a narrow pulse width and rises in synchronism with the rise of the pulse signal T1. Then, the timing circuit 35 generates timing signals T3, T4 and T5 as shown in FIG. 2. The timing signal T3 becomes LOW in synchronism with the rise of the pulse signal T2 and gives a low active preset signal to the counter 32 and a counter 36 to preset the counters 32 and 36. The timing signal T3 remains LOW as a presetting signal for a predetermined time interval. A time interval in which the timing signal T3 is HIGH corresponds to the measuring period T. The timing signal T5 changes HIGH and LOW in synchronism with the fall of the timing signal T3. The period of the timing signal T5 is twice that of the timing signal T3. The period of the timing signal T5 corresponds to one pressure measuring cycle. The timing signal T5 is applied to an analog with 41. The analog switch 41 transfers the reference pulse signal of the reference pulse signal generating circuit 50 to the up-terminal of the counter 36 while the timing signal T5 is HIGH and transfers the measuring pulse signal of the measuring pulse signal generating circuit 60 to the down-terminal of the counter 36 while the timing signal T5 is LOW.

The counter 36 counts up by one at a time in synchronism with the reference pulse signal fr and counts down by one at a time in synchronism with the measuring pulse signal fs. An initial value $N_0$ set by an offset setting circuit 39 is incremented in synchronism with the reference pulse signal fr in the measuring period Ta and the count value of the counter B is decremented in synchronism with the measuring pulse signal fs in the next measuring period Tb.

A latch 37 latches the count value of the counter 36 when the timing signal T4 goes HIGH, i.e., at the end of the measuring period Tb (at the end of one pressure measuring cycle), and gives the count value to a buffer circuit 40. The output value of the buffer circuit 40 indicates a value of a measured pressure.

The operation of the capacitive pressure sensing device 10 will be described hereinafter.

The offset setting circuit 39 sets the initial value $N_0$. The counter 36 is set for the initial value $N_0$ at time t1 when the timing signal T3 goes LOW. At time t2, the counter 36 starts counting-up to increment the initial value $N_0$ by one at a time in synchronism with the output pulse signal fr of the reference pulse signal generating circuit 50. If the number of pulses of the output pulse signal provided by the reference pulse signal generating circuit 50 in the measuring period Ta is Na, the count value of the counter 36 at time t3 is $N_0+Na$.

At time t3, the normally closed contact of the analog switch 41 is opened and the normally open contact of the same is closed to apply the output pulse signal fs of the measuring pulse signal generating circuit 60 to the downterminal of the counter 36. Then, the counter 36 starts counting-down at time t4 to decrement its count value by one at a time in synchronism with the measuring pulse signal fs. At time t5 when the measuring period Tb terminates, the count value of the counter 36 is latched by the latch 37. If the number of pulses of the output pulse signal fs of the measuring pulse signal generating circuit 60 is Nb, the latched value by the latch 37 at time t5 is $N_0+Na-Nb$. The value $(N_0+Na-Nb)$ indicates a measured pressure relative to the reference pressure. The offset value can optionally be changed by changing the initial value $N_0$ set by the offset setting circuit 39.

The numbers Na and Nb of pulses are caused to change by the variation of the ambient conditions, such as temperature. Here the respective temperature or pressure dependent variable parts of Na and Nb are represented by $\Delta a(T)$ and $\Delta b(T,P)$, and the respective constant components of the same are $Na_0$ and $Nb_0$; that is $$Na = Na_0 + \Delta a(T)$$

$$Nb = Nb_0 + \Delta b(T,P)$$

where, $\Delta a(T)$ is a function of only temperature because the capacitance of the reference capacitor Cr does not change with the pressure.

We can resolve $\Delta b(T,P)$ into the two components. One is an offset value $\Delta b_0(T)$ which does not depend on the pressure. The other is a pressure sensitive component $\alpha(T)\cdot(P-Pr)\cdot Nb_0$ which varies with the pressure. Where $\alpha(T)$ is a pressure sensitivity and Pr is a reference pressure. The pressure sensitivity is a function of temperature.

Accordingly, $$N_0+Na-Nb=(Na_0-Nb_0)+(\Delta a(T)-\Delta b_0(T))\\-\alpha(T)\cdot(P-Pr)\cdot Nb_0+N_0$$

We can make $\alpha(T)$ a temperature independent constant $\alpha$ by adjusting a temperature coefficient of a current supplied to the sensing capacitor Cx. Though the pressure independent value $\Delta b_0(T)$ is influenced to change to $\Delta b'_0(T)$ by adjusting the pressure sensitivity, we can make $\Delta a(T)-\Delta b'_0(T)$ zero by adjusting a temperature coefficient of a current supplied to the reference capacitor Cr.

Therefore, the count value N of the counter 36 is represented by $$N_0+Na-Nb=(Na_0-Nb_0)+N_0-\alpha\cdot(P-Pr)\cdot Nb_0.$$

That is, the count value N is a function of the only parameter of the pressure P.

(3) Reference Pulse Signal Generating Circuit and Measuring Pulse Signal Generating Circuit The reference pulse signal generating circuit 50 and the measuring pulse signal generating circuit 60 are the same in configuration and hence only the measuring pulse signal generating circuit 60 will be described.

Figure 7:
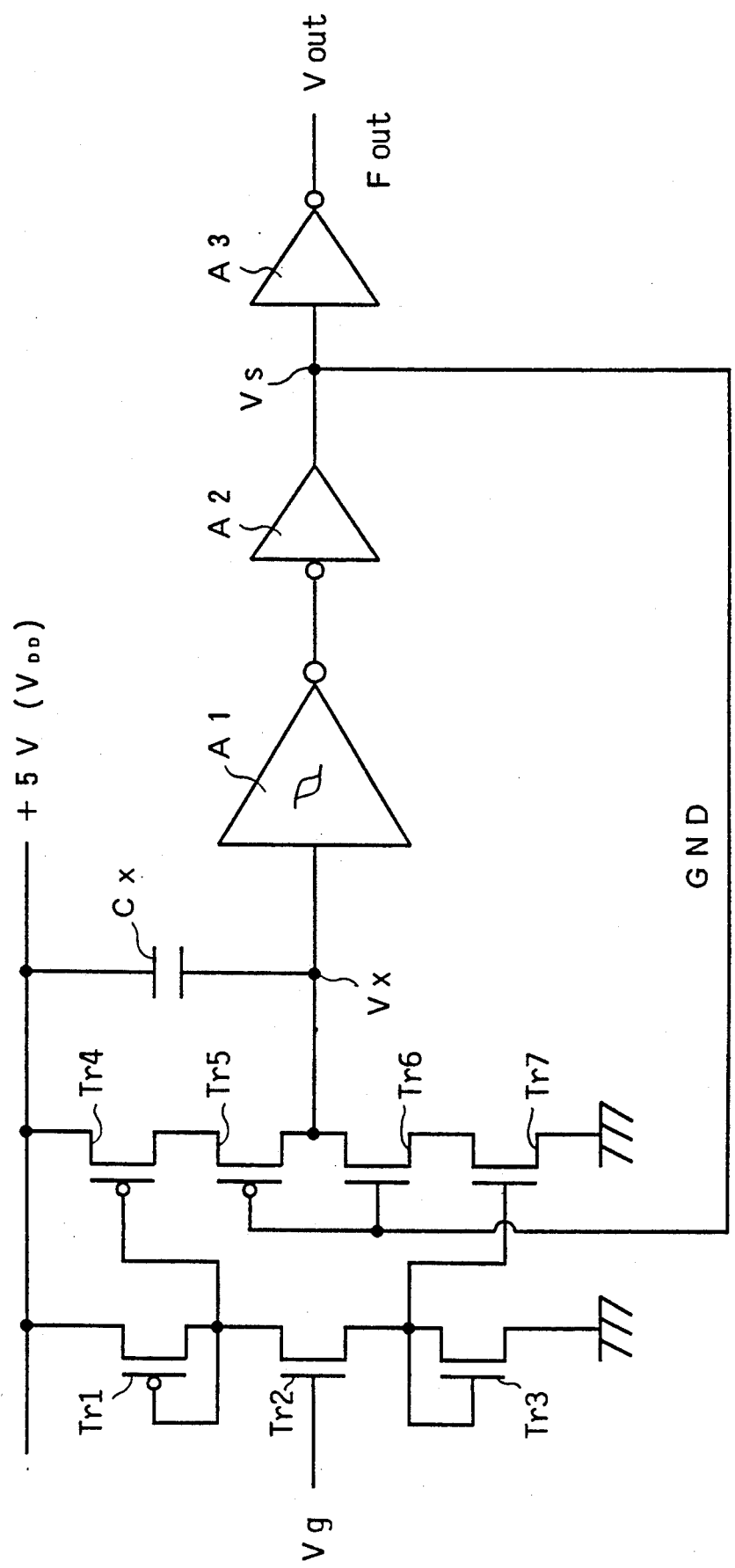
FIG. 7 is a circuit diagram of a measuring pulse signal generating circuit according to the first embodiment.

Referring to FIG. 7 showing the measuring pulse signal generating circuit 60, transistors Tr1, Tr4 and Tr5 are p-type MOS transistors and transistors Tr2, Tr3, Tr6 and Tr7 are n-type MOS transistors. A Schmidt trigger circuit A1 is shown in FIG. 7, inverters A2 and A3, and the sensing capacitor Cx having capacitance variable according to the pressure applied to the capacitive pressure sensing device 10.

The transistors Tr1 and Tr4 and the transistors Tr3 and Tr7 form current mirror circuits, respectively, and the source-drain current of the transistors is controlled by an input voltage Vg. The drain current of the p-type MOS transistors and that of the n-type MOS transistors are equal to each other. The sensing capacitor Cx is charged and discharged through a CMOSFET consisting of the transistors Tr5 and Tr6.

When the transistor Tr6 is in an ON state, a current supplied from a power supply $V_{DD}$ flows through the sensing capacitor Cx to the transistors Tr6 and Tr7 to charge the sensing capacitor Cx. The potential Vx of one of the terminals of the sensing capacitor Cx decreases at a rate corresponding to the ratio between the intensity of the charging current and the capacitance of the sensing capacitor Cx.

When the transistor Tr5 is in an ON state, the charge of the sensing capacitor Cx is discharged through the transistors Tr4 and Tr5, and the potential Vx increases at a rate corresponding to the ratio between the intensity of the discharge current and the capacitance of the sensing capacitor Cx.

Figure 8:
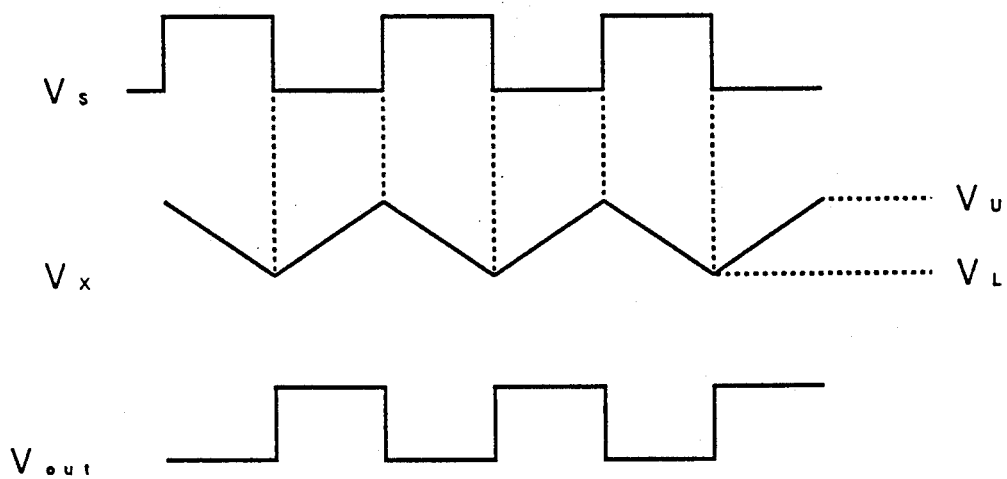
FIG. 8 is a timing chart for explaining an operation of the measuring pulse signal generating circuit of FIG. 7.

FIG. 8 shows the variation of potentials Vs, Vx and Vout. The gradient of increase and decrease of the potential Vx is equal to the ratio between the capacitance of the sensing capacitor Cx and the intensity of the discharge current. Accordingly, the frequency of the output potential Vout varies in inverse proportion to the capacitance of the sensing capacitor Cx, because the intensity of the discharge current and that of the charging current are constant. Thus, the capacitance representing the pressure can be estimated from the frequency.

Figure 9:
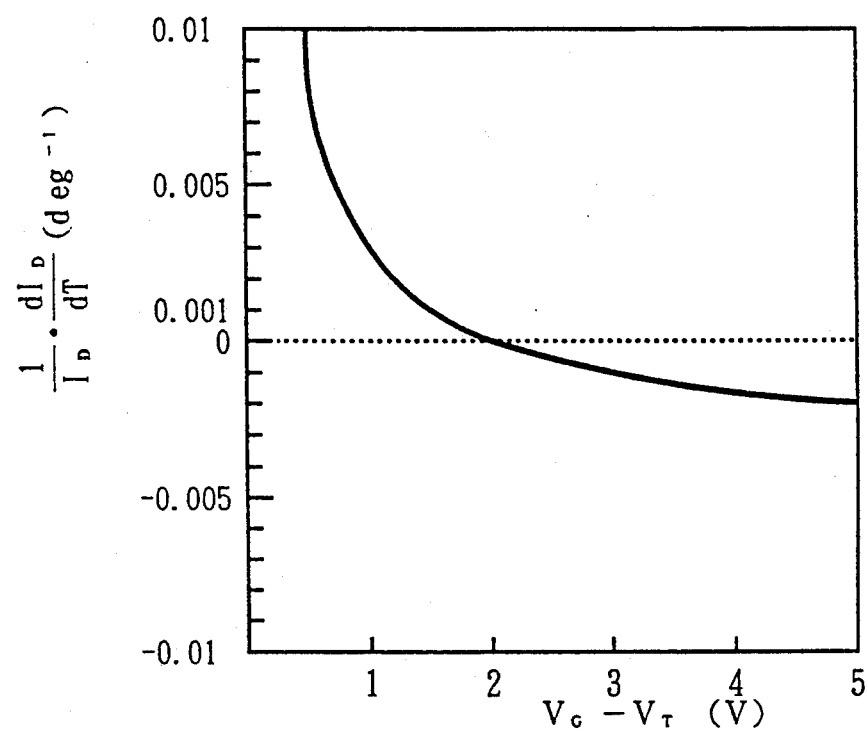
FIG. 9 is a graph showing a relation between a voltage and a temperature coefficient of a drain current of a MOSFET shown in FIG. 7.

FIG. 9 shows the characteristic curve of the temperature coefficient $dI_D/dT/I_D$ of a drain current $I_D$ of the MOSFET for $V_G-V_T$, where $V_G$ is the gate voltage and $V_T$ is the threshold voltage. The temperature compensation of the sensing capacitor Cx, i.e., the temperature characteristic of zero point or sensitivity, can be achieved by changing the input voltage Vg to set the temperature coefficient of the charging and discharging currents flowing to the sensing capacitor Cx to be suitable.

Thus, the temperature characteristic of the measuring pulse signal generating circuit 60 can be regulated by adjusting the input voltage Vg. Similarly, the temperature characteristic of the reference pulse signal generating circuit 50 can be regulated by adjusting the input voltage Vg.

Accordingly, the input voltage Vg of the measuring pulse signal generating circuit 60 is regulated for the temperature compensation of the pressure sensitivity, and therefore the input voltage Vg of the reference pulse signal generating circuit 50 is regulated for the temperature compensation of the zero point.

Figure 10:
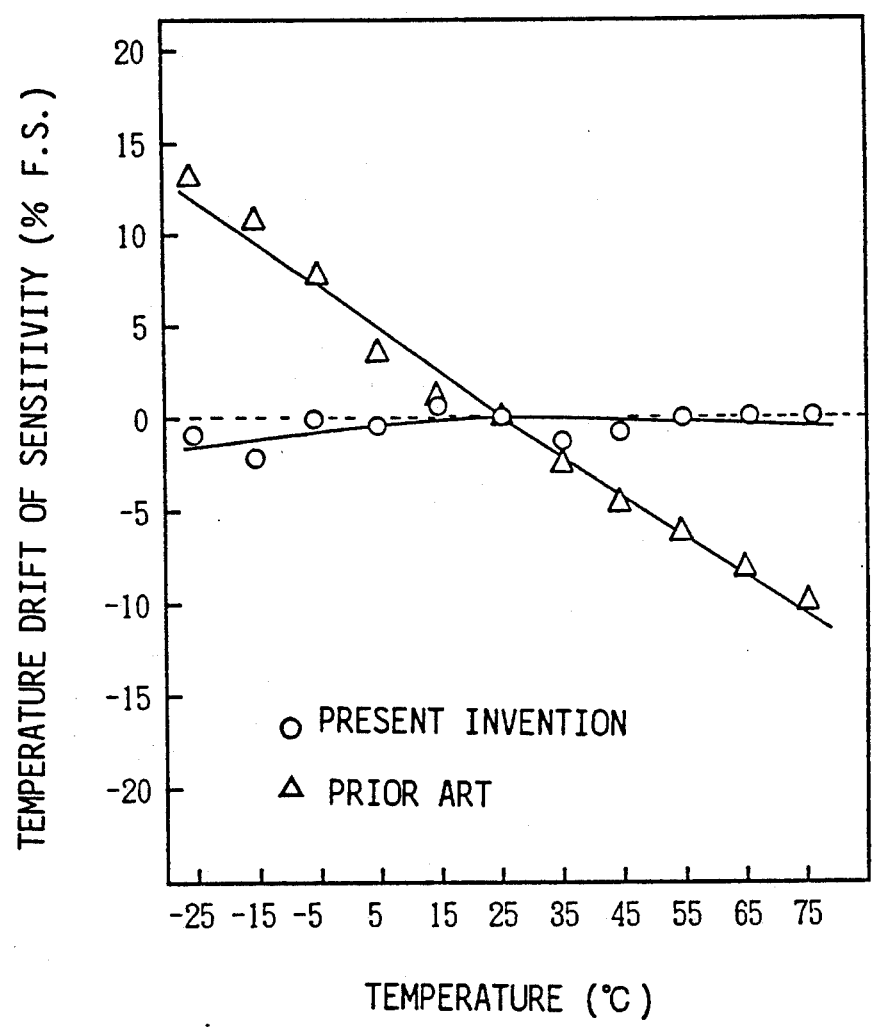
FIG. 10 is a graph showing a measured relation between a temperature coefficient of a detection sensitivity and a temperature in the first embodiment and the prior art capacitive sensing device.

FIG. 10 shows comparatively the variation of the temperature-compensated sensitivity of the capacitive pressure sensing device of the present invention for temperature, and that of the sensitivity of the prior art capacitive pressure sensing device for temperature, in which the temperature characteristic of the sensitivity is not compensated. The present invention reduces the temperature coefficient of the sensitivity from 0.23%/°C. (Prior art) to 0.026%/°C. in the temperature range of −25° C. to 75° C., and from 0.23%/°C. (prior art) to 0.021%/°C. in the temperature range of 25° C. to 75° C.

Figure 11:
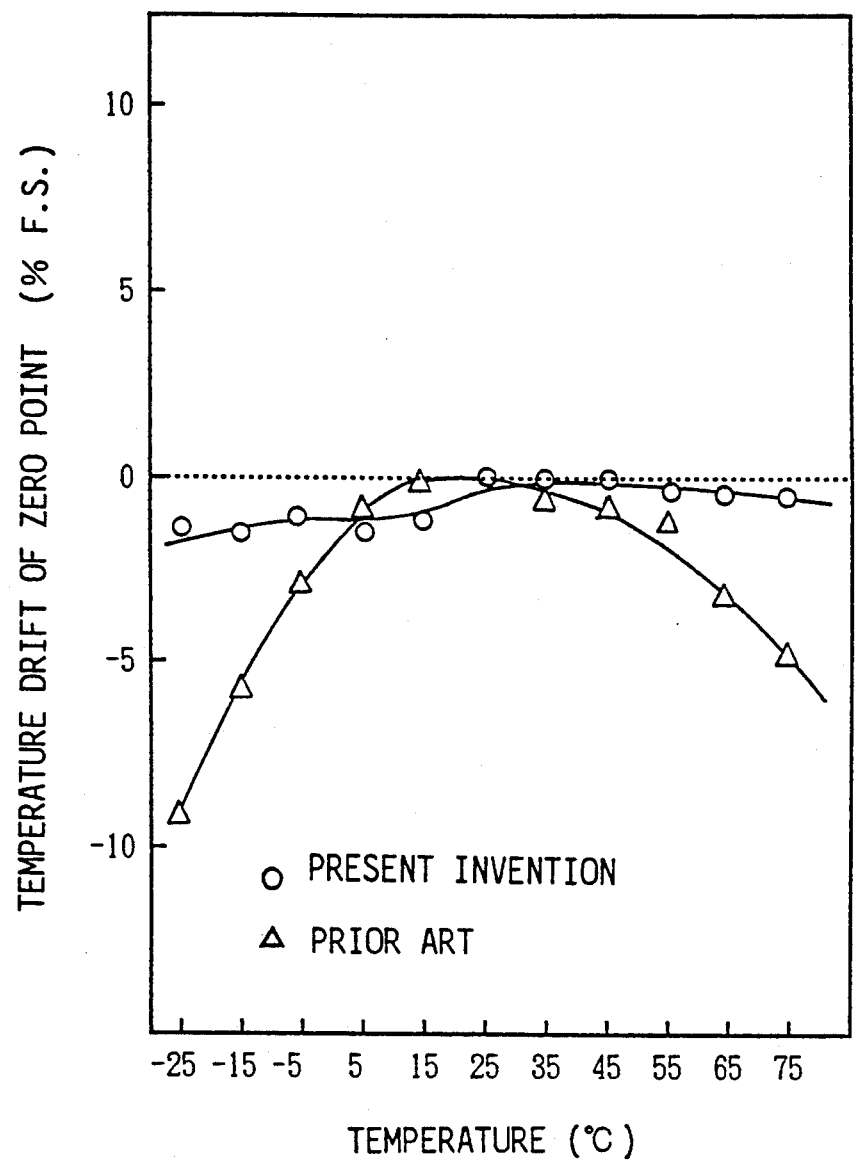
FIG. 11 is a graph showing a measured relation between a temperature coefficient of an offset value, i.e., a zero point, of a detection value and a temperature in the first embodiment and the prior art capacitive sensing device.

FIG. 11 shows comparatively the temperature coefficient of the zero point deviation rate of the capacitive pressure sensing device of the present invention and that of the zero point deviation rate of the prior art capacitive pressure sensing device. The present invention reduces the temperature coefficient of the zero point from 0.08%/°C. (prior art) to 0.026%/°C. in the temperature range of −25° C. to 75° C., and from 0.10%/°C. (prior art) to 0.013%/°C. in the temperature range of 25° C. to 75° C.

Second Embodiment

A capacitive sensing device in the second embodiment according to the present invention has a feature that a measured pressure is obtained by calculating a frequency ratio between a measuring pulse signal and a reference pulse signal.

(1) Pressure Sensor

A pressure sensor according to the second embodiment is identical with that shown in FIG. 1.

(2) Capacitive Detecting Circuit

Figure 12:
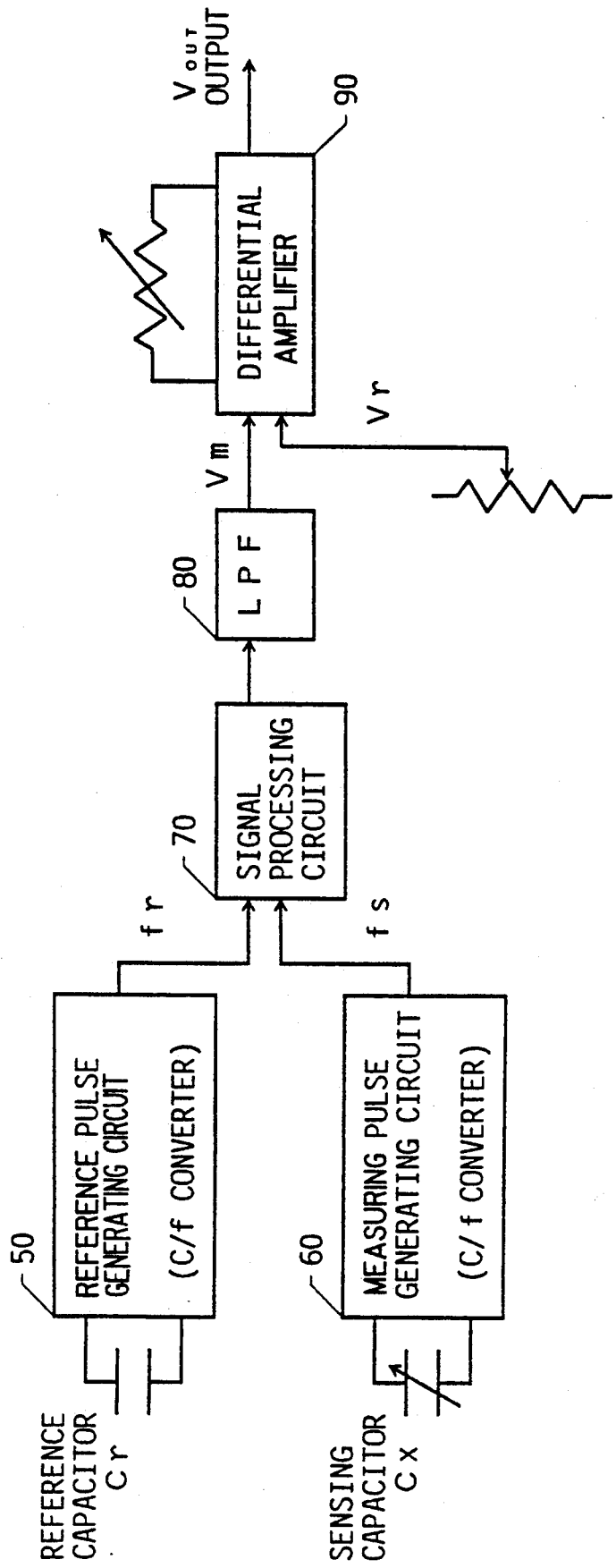
FIG. 12 is a circuit diagram of a pressure detecting circuit in the second preferred embodiment according to the present invention.

Referring to FIG. 12, a measuring pulse signal fs and a reference pulse signal fr are output from a measuring pulse generating circuit 50 and a reference pulse generating circuit 60, respectively, which are identical with the circuit shown in FIG. 7 of the first embodiment. The measuring and reference pulse signals fs and fr input into a signal processing circuit 70, the output signal of which inputs in an LPF 80, i.e., low pass filter. The output signal Vm of the LPF 80 and a reference voltage Vr input into a differential amplifier 90, where the difference voltage between the both signals Vm and Vr is obtained to be amplified. A voltage Vout is output from the differential amplifier 90.

(3) Reference Pulse Signal Generating Circuit and Measuring Pulse Signal Generating Circuit Those circuits 50 and 60 are identical with that shown in FIG. 7 according to the first embodiment.

(4) Signal Processing Circuit

Figure 13:
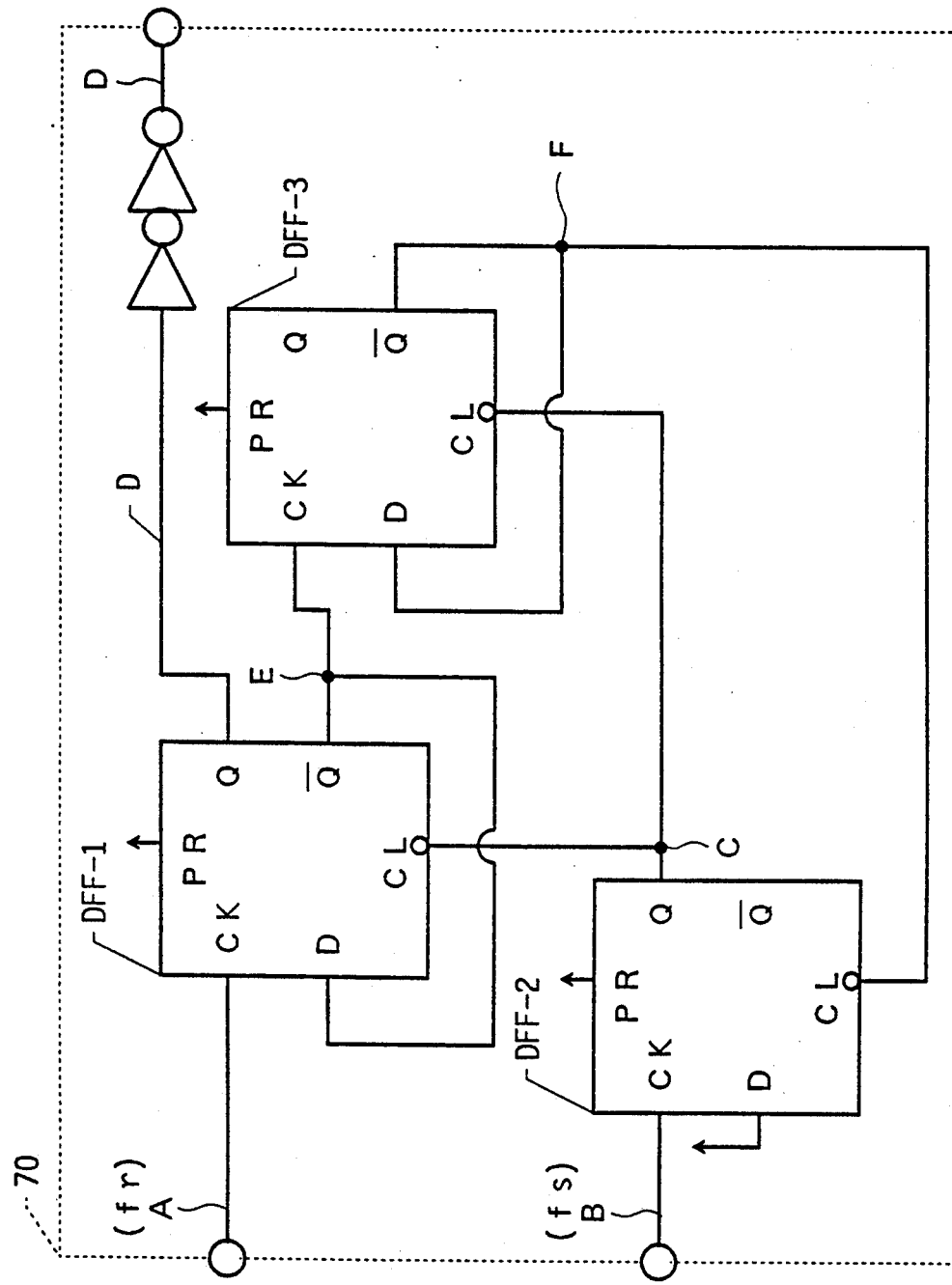
FIG. 13 is a circuit diagram of the signal processing circuit shown in FIG. 12.

Referring to FIG. 13, the signal processing circuit 70 comprises three D(delayed)-type flip flop circuits DFF-1, DFF-2 and DFF-3. The reference pulse signal fr and the measuring pulse signal fs input into CK-terminals of the circuits DFF-1 and DFF-2, respectively.

A Q-terminal output of the circuit DFF-1 is amplified by amplifiers to be input into the LPF 80. An inversion Q-terminal output of the circuit DFF-1 inputs in a D-terminal of the circuit DFF-1 and a CK-terminal of the circuit DFF-3. An inversion Q-terminal output of the circuit DFF-3 inputs in a D-terminal of the circuit DFF-3 and a CL(clear)-terminal of the circuit DFF-2. A Q-terminal output of the circuit DFF-2 inputs into CL-terminals of the circuits DFF-1 and DFF-2, respectively.

Figure 14:
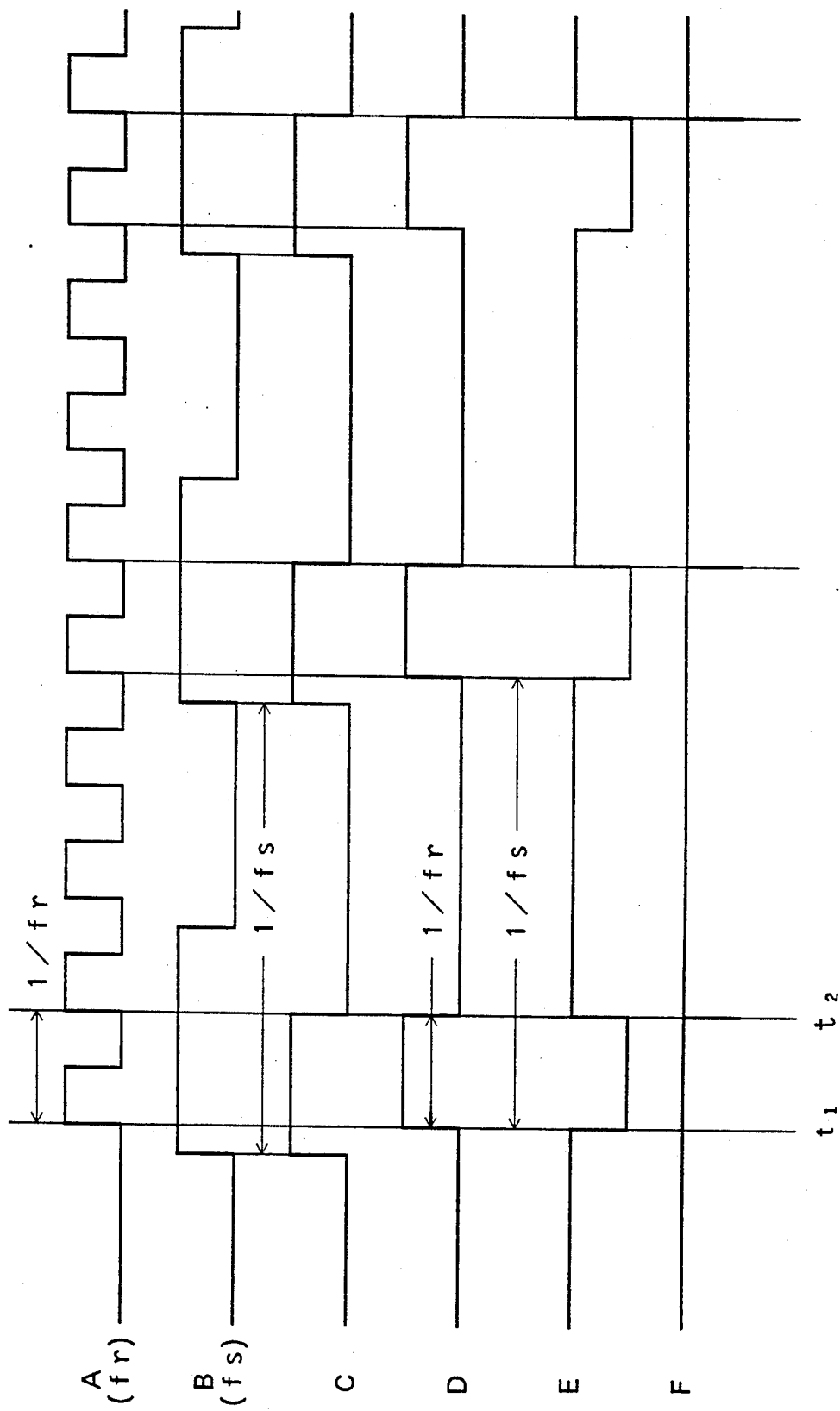
FIG. 14 is a timing chart for explaining an operation of the signal processing circuit shown in FIG. 12.

FIG. 14 shows voltage waveforms at positions A-F in FIG. 13. In FIG. 14, waveforms A and B are waveforms of the reference pulse signal fr and the measuring pulse signal fs, respectively. Waveforms C, D, E and F are waveforms of output signals of the Q-terminal of the circuit DFF-2, the Q-terminal of the circuit DFF-1, the inversion Q-terminal of the circuit DFF-1 and the inversion Q-terminal of the circuit DFF-3, respectively.

The circuit DFF-1 is reset at an initial state before measuring the pressure, i.e., the inversion Q and D-terminals are HIGH. Accordingly the circuit DFF-1 is set at time t1 when the reference pulse signal fr rises, i.e., the signal level of the Q-terminal of the circuit DFF-1 becomes HIGH in synchronism with the first rise of the signal fr. As soon as the circuit DFF-1 is set, the signal level at the D-terminal of the circuit DFF-1 changes from HIGH to LOW.

After the transition the circuit DFF-1 is reset at time t2, i.e., the signal level of the Q-terminal of the circuit DFF-1 changes from HIGH to LOW in synchronism with the second rise of the signal fr.

Otherwise, the circuit DFF-2 is set in synchronism with a rise of the measuring pulse signal fs, i.e., the signal level of the Q-terminal of the circuit DFF-2 changes from LOW to HIGH in synchronism with the rise of the signal fs.

When the Q-terminal of the circuit DFF-2 is HIGH, the circuits DFF-1 and DFF-2 are released from a fixed reset state to become changeable of the state according to input signals at the CK and D-terminals.

Otherwise, the circuit DFF-3 is set at time t2 in synchronism with a rise of the input signal at the CK-terminal of the circuit DFF-3, i.e., a fall of the signal D. As soon as the circuit DFF-3 changes from a reset state to a set state, the inversion Q-terminal of the circuit DFF-3 become LOW to clear the circuit DFF-2, i.e., the circuit DFF-2 is reset and the Q-terminal of the circuit DFF-2 changes from HIGH to LOW. At that time, the circuit DFF-3 is cleared to be reset and the inversion Q-terminal of the circuit DFF-3 changes from LOW to HIGH to release the circuit DFF-2 from the fixed reset state.

Here, the frequencies of the measuring and reference pulse signals fs and fr are decided so that at least two rises of the reference pulse signal fr are in a HIGH-level period of the measuring pulse signal fs, i.e., the frequency fr of the reference pulse signal is set to be higher than twice the frequency fs of the measuring pulse signal. This frequency setting is realized by setting a ratio of a capacitance of the sensing capacitor Cx to a capacitance of the reference capacitor Cr more than two.

In the condition described above, a HIGH-level period and one period of the output signal D of the signal processing circuit 70 are equal to a period 1/fr of the reference pulse signal and a period 1/fs of the measuring pulse signal, respectively.

Accordingly, a duty ratio of the output signal D is represented by the following equation.

$$\begin{aligned} D.R. &= Tr(T)/Ts(T) \\ &= fs(T)/fr(T) \\ &= \{fs + \Delta fs(T)\}/\{fr + \Delta fr(T)\} \\ &= \{fs + \Delta fs(T)/fs\}/\{fr + \Delta fr(T)/fr\} \cdot (fs/fr) \end{aligned}$$

Figure 15:
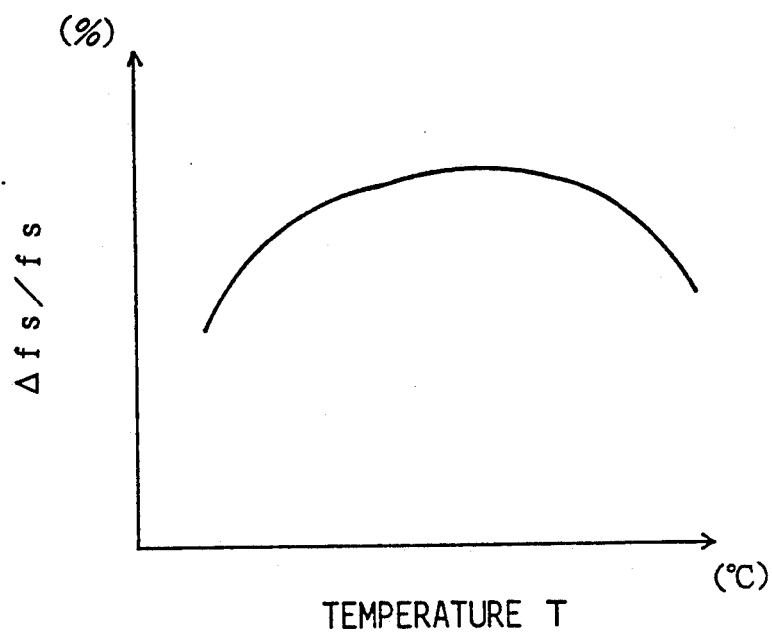
FIGS. 15(a) and 15(b) are graphs showing a relation between frequency deviation rates and a temperature in a reference signal pulse generating circuit and a measuring signal pulse generating circuit shown in FIG. 12, respectively.
Figure 15:
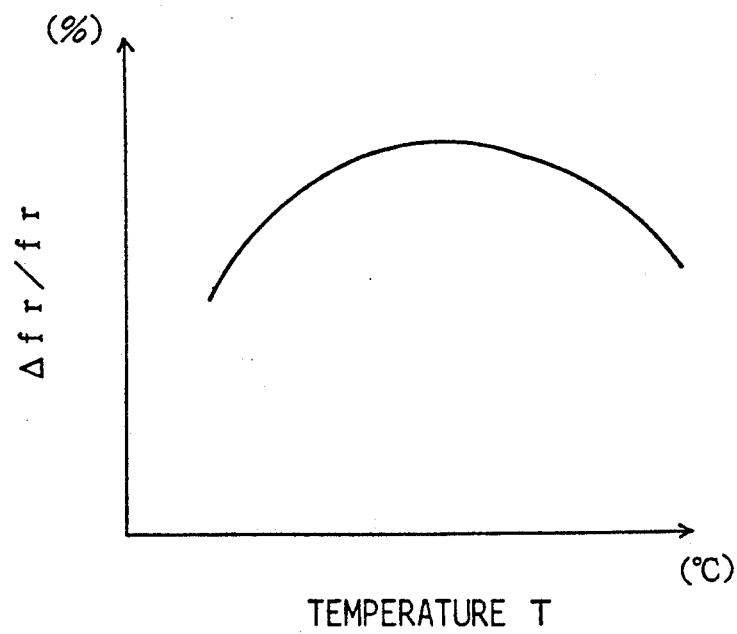

We can satisfy $$\Delta fs(T)/fs = \Delta fr(T)/fr$$

for a temperature variation as shown in FIGS. 15(a) and 15(b) by adjusting the input voltages Vg of the reference pulse generating circuit 50 and the measuring pulse signal generating circuit 60.

When these conditions are satisfied, the duty ratio D.R. is fs/fr.

The duty ratio D.R. is a function of only parameter of the pressure P and does not depend on the temperature T.

Figure 16:
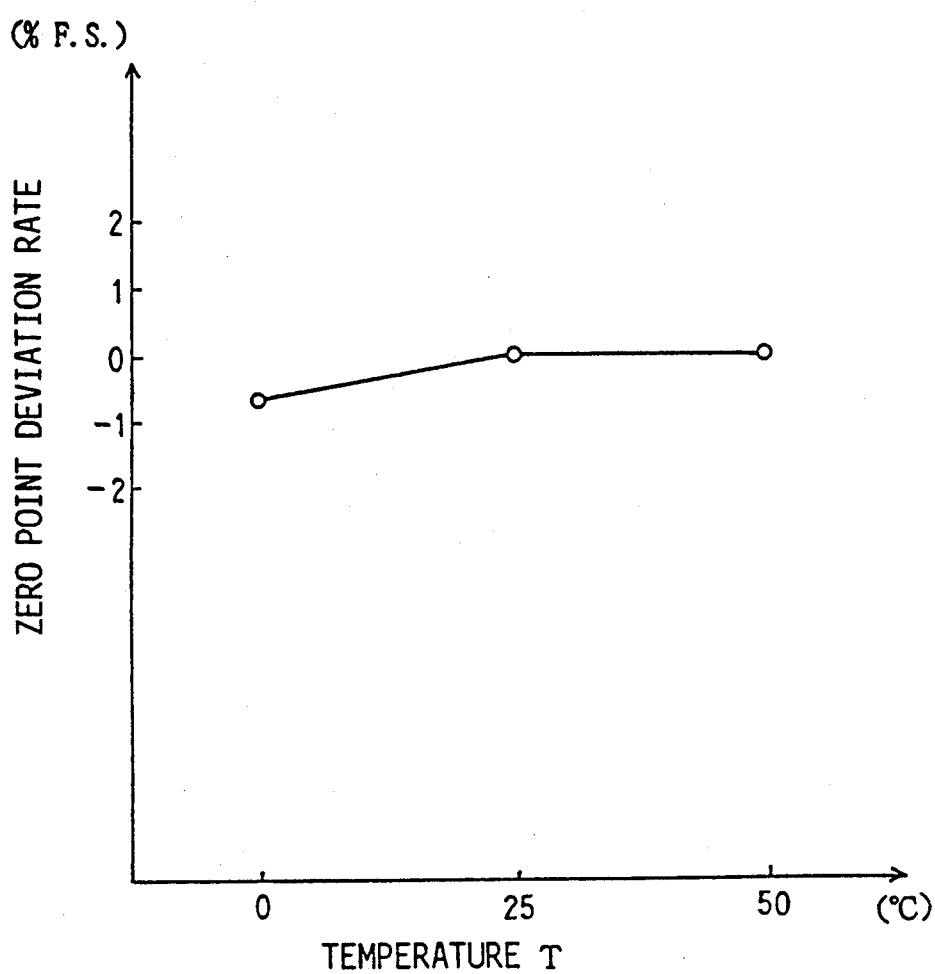
FIG. 16 is a graph showing a measured relation between a temperature coefficient of an offset value, i.e., a zero point, of a detection value and a temperature in the second embodiment.
Figure 17:
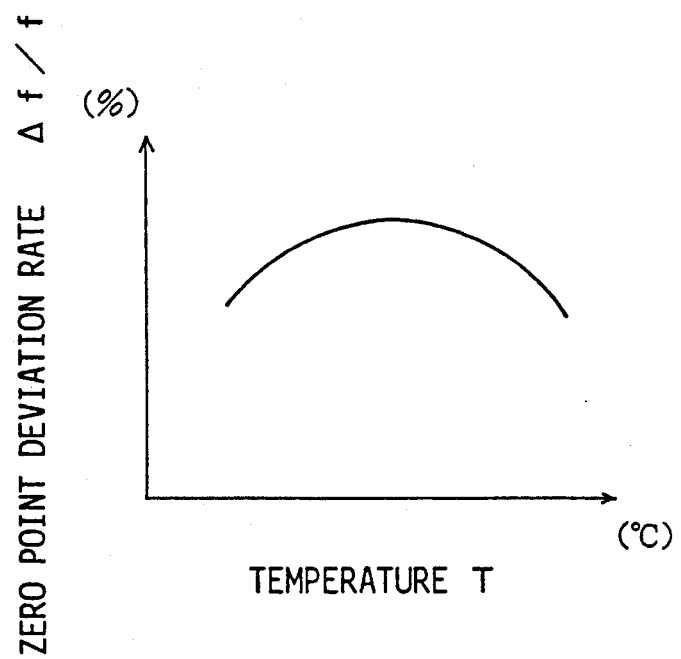
FIG. 17 is a graph showing a measured relation between a temperature coefficient of an offset value, i.e., a zero point, of a detection value and a temperature in the prior art capacitive sensing device.

FIG. 16 shows a measured deviation rate of the duty ratio D.R. for a temperature when the pressure P is the reference pressure Pr. The curve of the deviation rate of a zero point for a temperature is very flat in comparison with that of a prior art device.

Though the temperature compensation of the zero can compensate the temperature characteristics of the pressure sensitivity of the duty ratio D.R. of the output signal D of the signal processing circuit 70.

In this adjustment, the input voltage Vg of the measuring pulse generating circuit 60 is adjusted so that the temperature deviation of the pressure sensitivity of the measuring pulse signal fs may become minimum, and the input voltage Vg of the reference pulse generating circuit 50 is adjusted so that the temperature deviation of the zero point of the reference pulse signal fr may become minimum. The temperature characteristics of the zero point of the measured pressure value are not compensated in the adjustment described above. However, the adjustment is effective for detecting an amplitude of an alternative pressure or a pressure difference because it is necessary for the pressure sensitivity temperature characteristics to be compensated but it is not necessary for the zero point temperature characteristics to be compensated.

We may fabricate a MOS capacitor in the circuit 14 as the reference capacitor Cr of the reference pulse generating circuit 50 instead of the sub-reference chamber 16, the correction electrodes 27 and 17.

In this case because a dimension of the MOS capacitor is very small, we can supply a smaller and cheaper pressure detection device.

The device may be an acceleration detection device other than the pressure detection device.

Thus, in the present invention, the capacitive pressure sensing device is capable of compensating the temperature characteristics of the zero point of the detection value due to the influence of temperature and other factors. The offset value of the detection value can readily be changed by changing the initial value of the differential arithmetic circuit.

In the first embodiment, the difference between the frequency of the reference pulse signal and the frequency of the measuring pulse signal is regulated so that the temperature drift of the sensitivity is reduced to a minimum and the temperature drift of the zero point is reduced to a minimum, and the differential arithmetic circuit provides a digital output of a satisfactory temperature characteristic proportional to the measured force.

Since the measuring capacitor and the reference capacitor are similar to each other in construction, and the measuring pulse signal generating circuit and the reference pulse signal generating circuit are similar to each other in construction, the temperature characteristic of the zero point of the difference between the reference frequency and the measuring frequency can be improved.

In a third aspect of the present invention, the measuring pulse signal generating circuit and the reference pulse signal generating circuit comprise each a constant current power circuit having a transistor to charge and discharge the measuring capacitor and the reference capacitor between two predetermined voltage levels, and a circuit having a transistor that varies the temperature characteristic of the charging and discharging currents according to the input voltage.

Accordingly, the temperature coefficient of the drain current of the transistor can properly be determined by using a proper input voltage and, consequently, the temperature characteristics of the measuring capacitor and the reference capacitor can be compensated by changing the temperature characteristics of the charging and discharging currents. Thus, the capacitive sensing device is able to provide an output having a small temperature drift.

What is claimed is:

1. A capacitive sensing device comprising:
    a sensing capacitor having capacitance variable according to a variation of a force to be measured;
    a measuring pulse signal generating circuit connected to said sensing capacitor for generating a measuring pulse signal with a frequency in accordance with capacitance of said sensing capacitor;
    a reference capacitor having a reference capacitance that is not affected by said force;
    a reference pulse signal generating circuit connected to said reference capacitor, having a construction similar to that of said measuring pulse signal generating circuit and capable of generating a reference pulse signal with a frequency in accordance with said reference capacitance; and
    a signal processing circuit for calculating a value of said force from frequencies of said reference pulse signal and said measuring pulse signal,
    wherein said measuring pulse signal generating circuit and said reference pulse signal generating circuit have oscillation circuits that provide said measuring pulse signal and said reference pulse signal, respectively, ratios of frequency deviations of said measuring pulse signal and said reference pulse signal to temperature deviations being controlled by varying input voltages applied to said measuring pulse signal generating circuit and said reference pulse signal generating circuit, respectively;
    an input voltage applied to said measuring pulse signal generating circuit adjusted so that a detection sensitivity is nearly constant for a temperature variation; and
    an input voltage applied to said reference pulse signal generating circuit adjusted so that a ratio of a deviation of a frequency difference between said measuring pulse signal and said reference pulse signal to a temperature deviation is nearly constant for a temperature variation.

2. A capacitive sensing device according to claim 1 wherein;
    each of said measuring pulse signal generating circuit and said reference pulse signal generating circuit comprises a constant-current power circuit which alternatively charges and discharges said sensing capacitor or said reference capacitor, and a circuit having a transistor which changes a temperature characteristic of a charging and discharging current according to said input voltage.

3. A capacitive sensing device according to claim 1, wherein sad force is pressure.

4. A capacitive sensing device comprising:
    a sensing capacitor having capacitance variable according to a variation of a force to be measured;
    a measuring pulse signal generating circuit connected to said sensing capacitor for generating a measuring pulse signal with a frequency in accordance with capacitance of said sensing capacitor;
    a reference capacitor having a reference capacitance that is not affected by said force;
    a reference pulse signal generating circuit connected to said reference capacitor, having a construction similar to that of said measuring pulse signal generating circuit and capable of generating a reference pulse signal with a frequency in accordance with said reference capacitance; and
    a signal processing circuit for calculating a value of said force from frequencies of said reference pulse signal and said measuring pulse signal,
    wherein said signal processing circuit is a differential arithmetic circuit including an up-down counter, which circuit calculates a difference between a number of pulses of said reference pulse signal delivered to said up-down counter in a predetermined time interval and a number of pulses of said measuring pulse signal delivered to said up-down counter in said predetermined time interval and provides a value according to said difference as a detected value of said force.

5. A capacitive sensing device according to claim 4, wherein said signal processing circuit comprises:
    a reference clock generating circuit for generating a clock signal,
    a first counter which receives said clock signal and provides an output signal specifying said predetermined time interval in which a number of pulses of said reference pulse signal and a number of pulses of said measuring pulse signal are counted;
    a switching circuit for alternately passing said reference pulse signal and said measuring pulse signal according to said output signal of said first counter;
    said up-down counter having an up-terminal for receiving said reference pulse signal through said switching circuit and a down-terminal for receiving said measuring pulse signal through said switching circuit; and a latch circuit which latches a count value of said up-down counter at a predetermined moment.

6. A capacitive sensing device according to claim 4, wherein said force is pressure.

7. A capacitive sensing device comprising:

a sensing capacitor having capacitance variable according to a variation of a force to be measured;

a measuring pulse signal generating circuit connected to said sensing capacitor for generating a measuring pulse signal with a frequency in accordance with capacitance of said sensing capacitor;

a reference capacitor having a reference capacitance that is not affected by said force;

a reference pulse signal generating circuit connected to said reference capacitor, having a construction similar to that of said measuring pulse signal generating circuit and capable of generating a reference pulse signal with a frequency in accordance with said reference capacitance; and a signal processing circuit for calculating a value of said force from frequencies of said reference pulse signal and said measuring pulse signal, wherein said measuring capacitor comprises:

a pressure-sensitive diaphragm formed on a semiconductor substrate and capable of being deformed by pressured applied to said diaphragm, an upper substrate joined to said semiconductor substrate so as to form a first mating surfaces together with said pressure-sensitive diaphragm so that the interval between said first mating surfaces changes when pressure is applied to said diaphragm, a first electrode formed on said first mating surface of said pressure-sensitive diaphragm, and a second electrode formed on said first mating surface of said upper substrate;

and wherein said reference capacitor comprises:

second mating surfaces formed respectively on a rigid portion of said semiconductor substrate and said upper substrate and having an interval therebetween which is not changed by said pressure applied to said pressure-sensitive diaphragm, a first correction electrode formed on said second mating surface of said semiconductor substrate, and a second correction electrode formed on said second mating surface of said upper substrate.

8. A capacitive sensing device according to claim 7, wherein said first electrode and said first correction electrode are formed integrally on said surface of said semiconductor substrate.

9. A capacitive sensing device according to claim 7, wherein said force is pressure.

10. A capacitive sensing device comprising:

a sensing capacitor having capacitance variable according to a variation of a force to be measured;

a measuring pulse signal generating circuit connected to said sensing capacitor for generating a measuring pulse signal with a frequency in accordance with capacitance of said sensing capacitor;

a reference capacitor having a reference capacitance that is not affected by said force;

a reference pulse signal generating circuit connected to said reference capacitor, having a construction similar to that of said measuring pulse signal generating circuit and capable of generating a reference pulse signal with a frequency in accordance with said reference capacitance; and a signal processing circuit for calculating a value of said force from frequencies of said reference pulse signal and said measuring pulse signal, wherein said signal processing circuit comprises means for calculating a ratio of a frequency of said reference pulse signal to a frequency of said measuring pulse signal and outputs a value of said ratio as a detected value of a said force.

11. A capacitive sensing device according to claim 10, wherein a frequency of one of said references pulse signal and said measuring pulse signal is higher than two times a frequency of other signal;

said signal processing circuit has means for generating a duty ratio signal which indicates the ratio between a period of a signal with a lower frequency of said two pulse signals and a period of a signal with a higher frequency of said two pulse signals, and calculates said detected value of said force on the basis of a duty ratio of said duty ratio signal.

12. A capacitive sensing device according to claim 10, wherein said force is pressure.

* * * * *